United States Patent
Nakayama

(10) Patent No.: US 6,850,237 B2
(45) Date of Patent: Feb. 1, 2005

(54) WAVEFORM RECORDING SYSTEM

(75) Inventor: Etsurou Nakayama, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 10/419,236

(22) Filed: Apr. 21, 2003

(65) Prior Publication Data
US 2003/0201993 A1 Oct. 30, 2003

(30) Foreign Application Priority Data
Apr. 24, 2002 (JP) .................................... 2002-121954

(51) Int. Cl.$^7$ .............................................. G06T 11/20
(52) U.S. Cl. ..................... 345/440; 345/440.1; 600/300
(58) Field of Search .............................. 345/440, 440.1, 345/440.2, 441, 179; 600/300, 301, 523, 524; 607/60

(56) References Cited

U.S. PATENT DOCUMENTS 5,550,963 A * 8/1996 Siegel et al. ................. 345/440
6,719,689 B2 * 4/2004 Munneke et al. ............ 600/300

FOREIGN PATENT DOCUMENTS

JP 2002-111506 * 4/2002

* cited by examiner

*Primary Examiner*—Matthew Luu
(74) *Attorney, Agent, or Firm*—Westerman, Hattori, Daniels, Adrian, LLP

(57) ABSTRACT

The present invention is characteristic in that a wave signal being measured is converted to wave data, compressed wave data is produced from wave data in a prescribed compression interval, and a part of the wave data in the compression interval used for display is re-compressed so that the range of wave data for display agrees with the range of wave data which is the origin of the compressed wave data, thereby improving the accuracy of waveform display.

10 Claims, 7 Drawing Sheets

WAVEFORM RECORDING SYSTEM

BACKGROUND OF THE INVENTION

1. Field of Invention

The present invention relates to a waveform recording system for electronifying and recording a prescribed input signal and indicating the waveform thereof on a display and, more particularly, to improvements in the display accuracy dependent on the relationship between the wave data and the compressed wave data.

2. Description of the Prior Art

Thanks to the recent dramatic increase in memory capacity, waveform recording systems have become capable of recording wave data over a prolonged period of time. As a result, however, the amount of data to be processed to replay waveforms has also become extremely large. To be able to quickly comprehend the whole image of wave data recorded over a long period, the system must meet the requirements for instantaneously making the wave data accessible as a single-frame view. In order to achieve this objective, a vast amount of wave data is previously compressed to produce compressed wave data. Then, the compressed wave data is saved in the memory, along with the original wave data.

When providing a single-frame view of the whole wave data, display image compression is performed according to the compressed wave data and, thus, display data is produced. Consequently, it is possible to display all measured waveforms in a short period of time. This logic is explained hereinafter with reference to the accompanying drawings.

FIG. 1 is a block diagram showing an example of the prior art waveform recording system.

In FIG. 1, an input of an analog wave signal to be measured is amplified and normalized by amp 3 using an appropriate gain applied to A/D converter 1, and digitized thereby for conversion to wave data. The wave data thus digitized by A/D-converter 1 is written to memory 4, as controlled by memory controller 2.

When providing the wave data thus written to memory 4 in a visual form, the wave data is retrieved as controlled by memory controller 2 and input to display image compressor 5, so that the data is compressed for display. Then, the compressed wave data is input to display 7 for display, as controlled by display controller 6. Display means 11 is comprised of display image compressor 5, display controller 6, and display 7.

Compression means 8 peak-to-peak (P-P) compresses the wave data digitized by A/D converter 1, on a channel-by-channel basis, at a compression ratio set in the compression means itself.

Upon receiving an input of the digitized wave data, compression means 8 calculates the maximum and minimum values contained in each prescribed number of wave data items that is set in real time in synchronization with the sampling rate of A/D converter 1. In other words, the compression means calculates "peak-to-peak (P-P) values" on a channel-by-channel basis.

For example, assuming that the compression ratio of compression means 8 is set to 1000, then the compression means outputs the maximum and minimum values once for 1000 items of wave data. Compression means 8 saves these maximum and minimum values, through memory controller 2, in an area other than the area of wave data in memory 4.

The compressed wave data, which is P-P compressed data provided by compression means 8, is stored in memory 4, through memory controller 2, along with the wave data digitized by A/D converter 1.

From among the items of wave data and compressed wave data stored in memory 4, specific data items are selected according to the preset display magnification and read through memory controller 2. Then, the data items are compressed by display image compressor 5 into display data. The display data thus compressed is sent to display controller 6 for visualization on display 7.

It should be noted that this example of the prior art system is described in Japanese Laid-open Patent Application 2002-111506.

As discussed above, it is possible to instantaneously display vast amounts of wave data saved in the memory.

In the prior art system, however, a trigger point is used as the reference point when acquiring and displaying wave data using a pre-trigger function. Therefore, the display start point of wave data does not always agree with the start point of an interval set off by a prescribed number of wave data items being compressed. Likewise, the end point of waveform display does not always agree with the endpoint of the compression interval. Consequently, disagreement occurs between the range of wave data for display and the range of wave data which is the origin of compressed wave data for display. It should be noted here that the term pre-trigger refers to a function in which a wave data item at a trigger point satisfying preset trigger conditions while wave data is being saved in the memory is used as the reference point, and waveforms for a prescribed period before and/or after the trigger point are displayed.

Also in the prior art system, there is the case that when wave data and compressed wave data stored in the memory are saved to another location or these data are analyzed on a different system, only the required parts thereof are copied from the memory to another medium. In this case, even if the wave data and compressed wave data are copied properly, an arbitrary range of the wave data is selected and, therefore, the range does not always agree with the range indicated by the start and end points of a compression interval. Consequently, the system has had the problem that disagreement occurs between the range of wave data that has been copied and the range of wave data which is the origin of the compressed wave data.

SUMMARY OF THE INVENTION

The object of the present invention is to solve the aforementioned problems and provide a waveform recording system wherein the range of wave data for display is made to agree with the range of wave data which is the origin of the compressed wave data, thereby improving the accuracy of waveform display.

DETAILED DESCRIPTION OF THE PREFERRED EMBODIMENTS

Preferred embodiments of the present invention are described in detail hereinafter with reference to the accompanying drawings.

Embodiment 1

Figure 1:
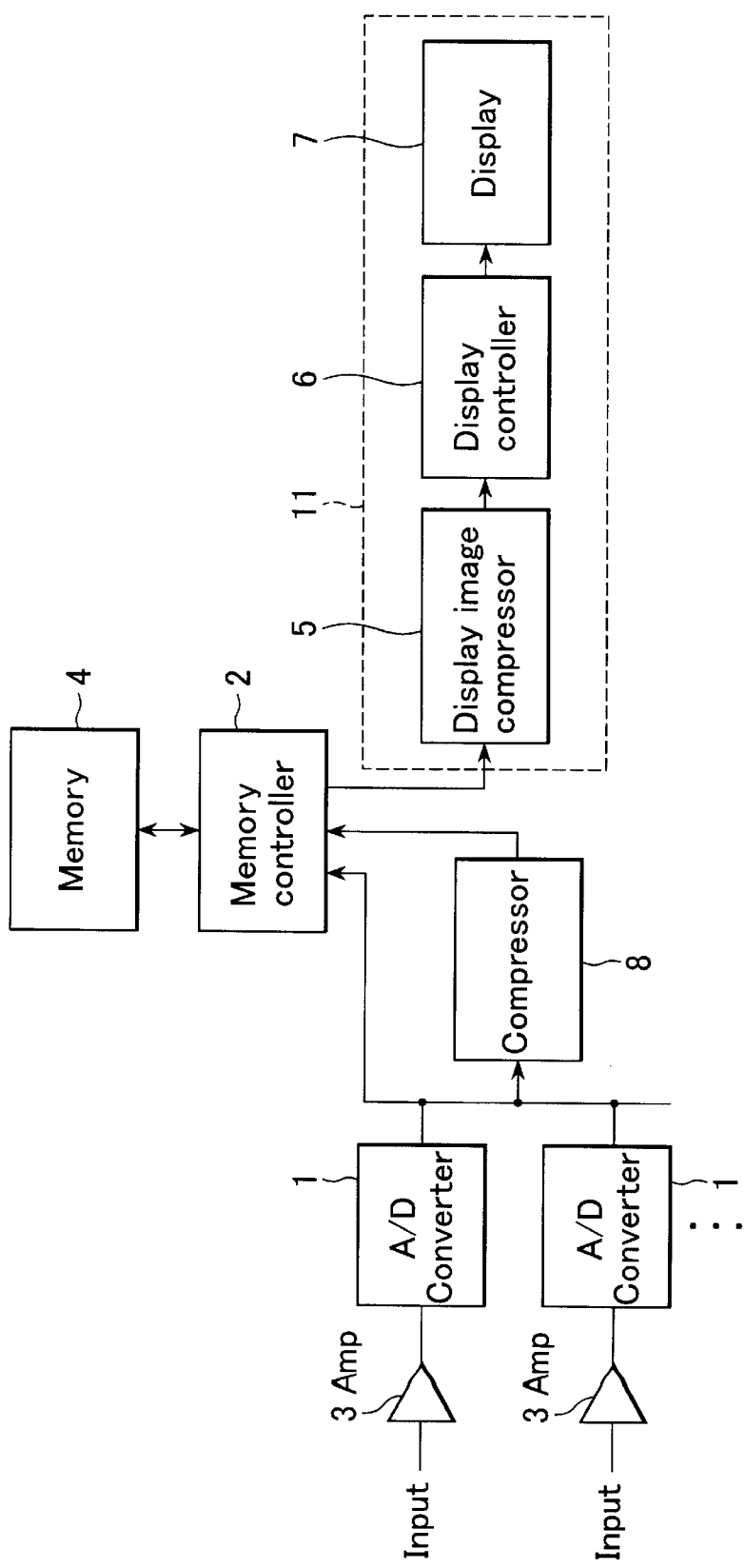
FIG. 1 is a block diagram showing an example of the configuration of the prior art waveform recording system.
Figure 2:
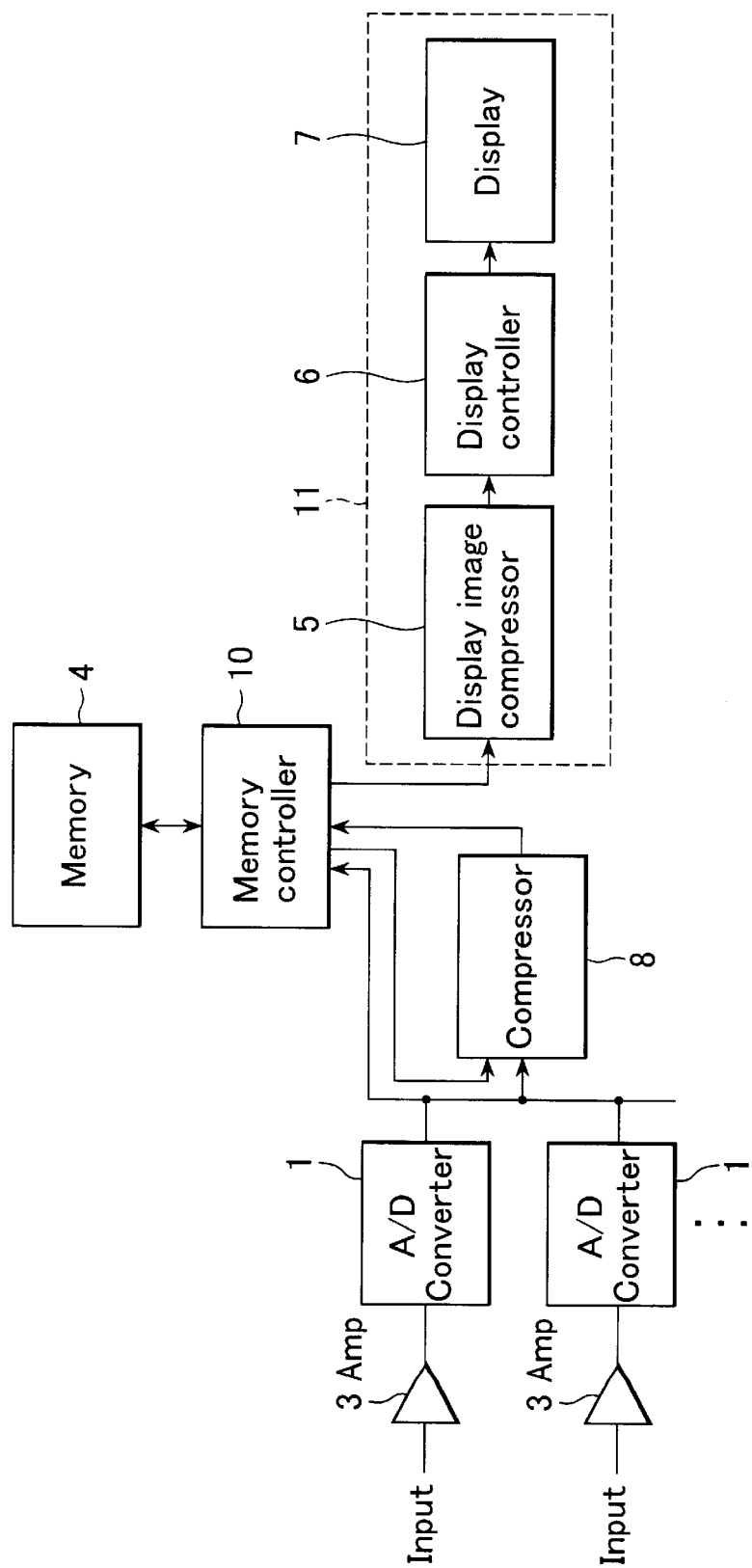
FIG. 2 is a block diagram showing embodiment 1 of the waveform recording system according to the present invention.

FIG. 2 is a block diagram showing embodiment 1 of the waveform recording system according to the present invention.

In FIG. 2, elements identical with those shown in the preceding figure are referenced alike and excluded from the description.

In FIG. 2, the system of embodiment 1 differs from the prior art system in that it is also possible to input wave data stored in memory 4 from memory controller 10 to compression means 8.

Figure 3:
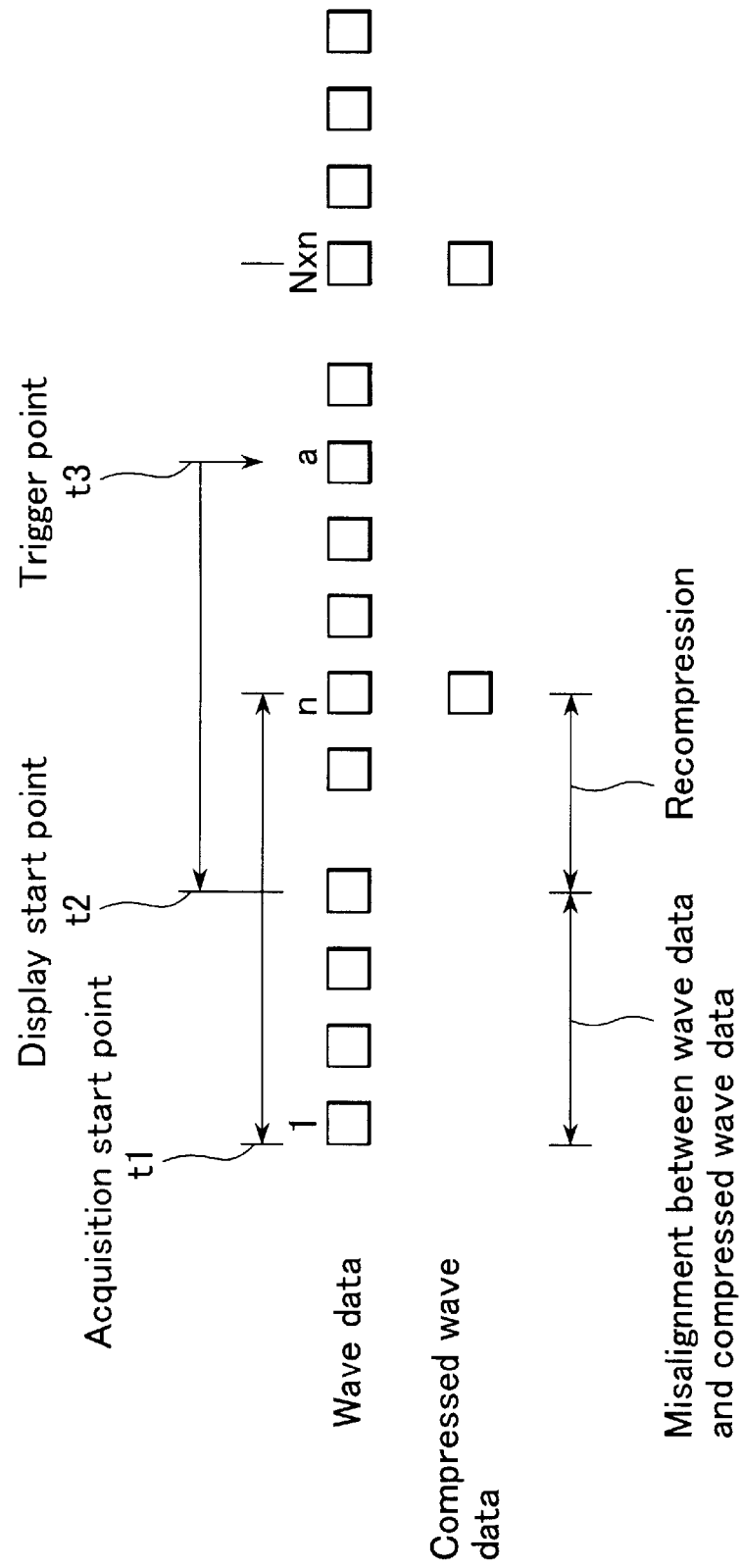
FIG. 3 is a schematic view illustrating the behavior of the system of embodiment 1 according to the present invention.

FIG. 3 is a schematic view illustrating the behavior of the system of embodiment 1 according to the present invention.

In FIG. 3, a case is shown wherein wave data acquisition begins at acquisition start point t1; wave data comprising a prescribed number of items (n items) is acquired for each compression interval; and thus compressed wave data is produced according to a preset data compression ratio and stored in memory 4.

Trigger signals are generated at arbitrary points of time, with no regard to the data compression ratio of wave data. Trigger point t3 indicates a point at which a trigger signal is generated and is currently positioned at wave data a. Wave data at display start point t2 is fixed depending on the time axis setting with reference to the length of time from trigger point t3.

Consequently, when compressed wave data is used in an attempt to achieve high-speed waveform displays, it occurs that the display start point t2 of the wave data does not agree with the acquisition start point t1 of n times of wave data acquisition, resulting in misalignment between the wave data and the compressed wave data.

For this reason, wave data stored in memory 4 for the interval from display start point t2 to the nth point of acquisition is input to compression means 8 by means of memory controller 10. Thus, the wave data is re-compressed to reproduce and store compressed wave data in memory 4. The compressed wave data is used as data at the display start point thereof.

This can be achieved by making it possible to identify the location at which wave data at a display start point is stored in the memory and the location at which wave data from which each set of compressed wave data is produced is stored in the memory.

Note that the function for identifying the storage locations of wave data can be incorporated in memory controller 10, or another control means can be provided.

The logic discussed above is also true with the processing of compressed data at the display end point of wave data for display. Specifically, the range of wave data from the start point of n times of acquisition in the compression interval containing a wave data display end point to the display end point is re-compressed, in order to reproduce and store compressed wave data in memory 4. This data is used as wave data at the display end point of the compressed wave data.

The same logic as discussed above also applies when the wave data and compressed wave data stored in the memory are copied. Specifically, wave data ranging from the start point of copying to the end point of a compression interval, among the wave data included in the compression interval containing the wave data's start point, is re-compressed. Thus, the wave data is used as start-point compressed wave data.

Likewise, the wave data ranging from the start point of the compression interval to the end point of copying, among the wave data included in the compression interval containing the wave data's end point of copying, is re-compressed. This data is used as the end-point compressed wave data.

As a result, there is no need for using the part of wave data responsible for misalignment between the views of wave data and compressed wave data. Thus, it is possible to prevent differences from arising between these views and displayed waveforms from being misidentified.

Another case to be considered is that from wave data and compressed wave data stored in the memory, only the necessary parts thereof are copied to another medium. Also in this case, the parts of the wave data responsible for misalignment between the wave data and the compressed wave data are not copied. This is advantageous to the control of measurement results and can prevent misidentification that may occur when waveforms are displayed for analysis.

In FIG. 2, an example is shown wherein only one compression means is used. Alternatively, it is possible to use two compression means, for example, compression means 8 and 9, or even three or more compression means. This matter will be discussed hereinafter with reference to the accompanying drawings.

Figure 4:
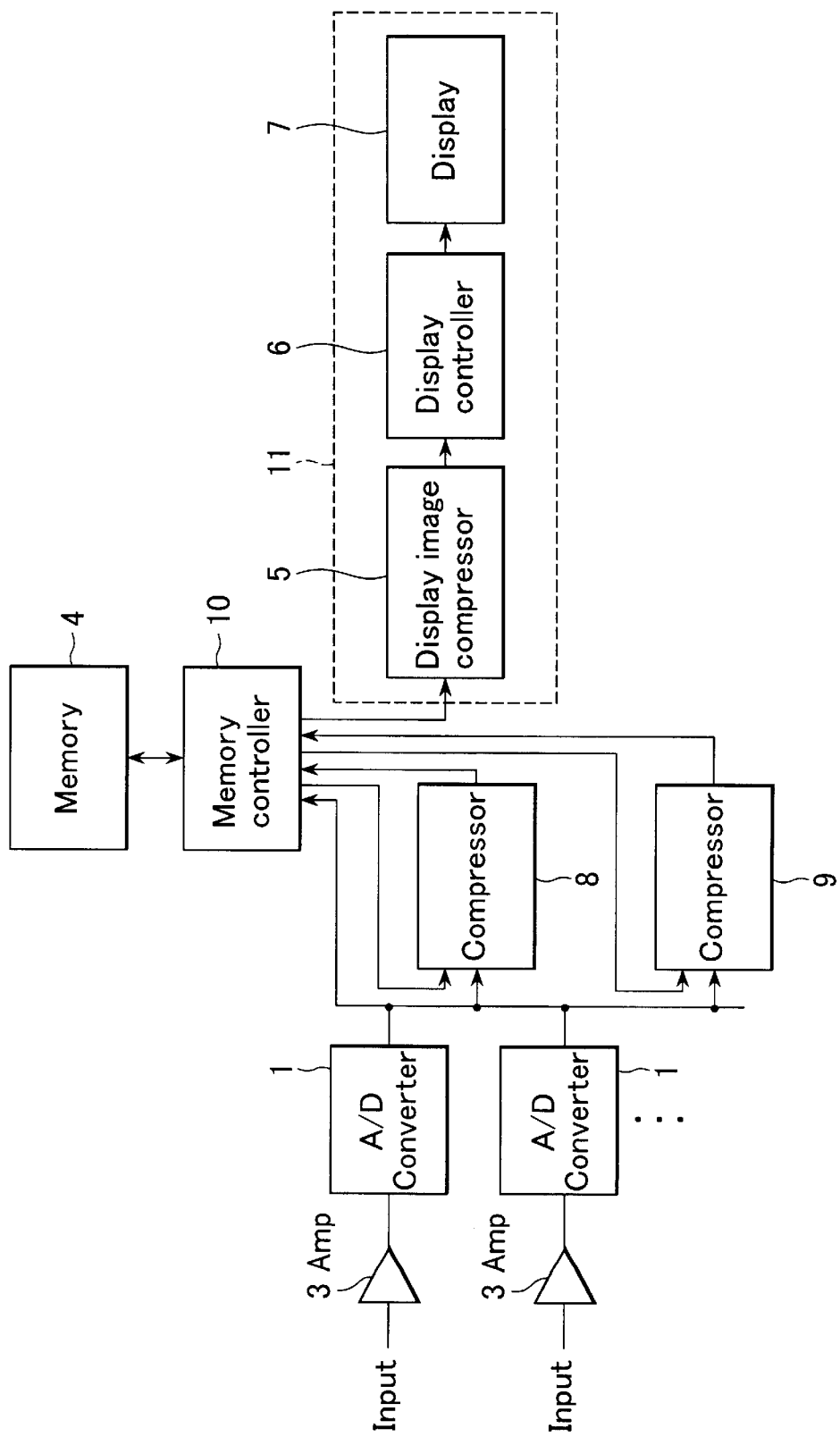
FIG. 4 is a block diagram showing another embodiment of the waveform recording system according to the present invention.

FIG. 4 is a block diagram showing another embodiment of the waveform recording system according to the present invention. In FIG. 4, elements identical to those shown in the preceding figures are referenced alike and excluded from the description.

In cases where a plurality of compression means are used as shown in FIG. 4, it is possible to set different data compression ratios separately for individual compression means. Thus, these compression means separately compress wave data digitized by A/D converters 1. It is permissible that the compression ratios of wave data compressed at different data compression ratios be changed as appropriate, according to a given display rate, and a plurality of compressed wave data be simultaneously stored in memory 4.

In the case of FIG. 4, for example, it is possible to set compression means 8 to a compression ratio of 1/1000 and compression means 9 to 1/5000. This corresponds to a case where waveforms are viewed at different display rates. For example, optimizing wave data for a full-wave single-frame view before compression will eliminate the need for compressed display processing. Consequently, it is possible to quickly provide a full-wave single-frame view. On the other hand, when providing a 10-fold zoom-in view of the wave data, for example, the resolution falls short of the required level since the wave data is excessively compressed. This means that the compressed wave data can no longer be used and, therefore, wave data must once again be compressed in order to reproduce compressed wave data for display.

In order to cope with this situation, compressed wave data consisting of a plurality of wave data P-P compressed at multiple steps of data compression ratio is previously produced, and compressed wave data produced at a data compression ratio optimum for a preset display magnification is used as waveform display data. This makes it possible to not only provide full-wave single-frame views but also show waveforms at high speeds for each display magnification.

Another advantage is that like the system of FIG. 3, it is possible to input wave data stored in memory 4 from memory controller 10 to each compression means. Consequently, also for compressed wave data with multiple compression ratios, there is no need for using the part of wave data responsible for misalignment between the wave data and the compressed wave data. Thus, it is possible to prevent errors from occurring between the views of the wave data and the compressed wave data and to prevent these views from being misidentified.

As has been described heretofore, according to the present invention there is no need for using the part of wave data responsible for misalignment between the views of the wave data and the compressed wave data. Consequently, it is possible to prevent errors from occurring between the views of the wave data and the compressed wave data, and to prevent these views from being misidentified.

It is also possible to previously produce compressed wave data consisting of a plurality of wave data P-P compressed at multiple steps of the data compression ratio, and to use compressed wave data produced at a data compression ratio optimum for a preset display magnification as waveform display data. This makes it possible to not only provide full-wave single-frame views but also to show waveforms at high speeds for each display magnification.

Also for compressed wave data with multiple compression ratios, there is no need for using the part of wave data responsible for misalignment between the wave data and the compressed wave data. Thus, it is possible to prevent errors from occurring between the views of the wave data and the compressed wave data, and to prevent these views from being misidentified.

Embodiment 2

Figure 5:
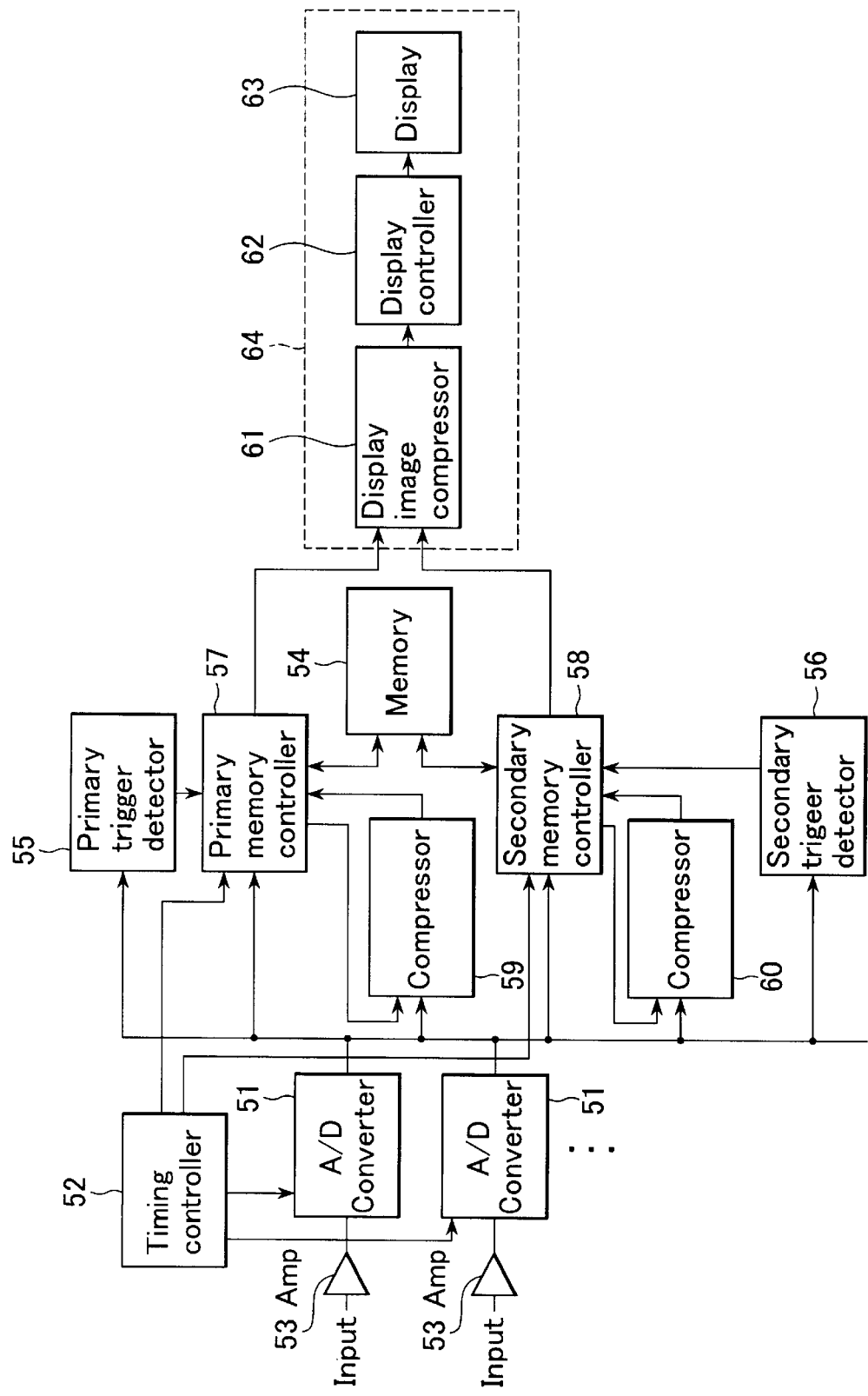
FIG. 5 is a block diagram showing embodiment 2 of the waveform recording system according to the present invention.

FIG. 5 is a block diagram showing embodiment 2 of the waveform recording system according to the present invention.

In FIG. 5, amp 53 amplifies or attenuates the waveforms being measured, on an input channel basis, in order to normalize the waveforms. A/D converter 51 digitizes and electronizes the normalized waveforms being measured.

Timing controller 52 controls the sampling rates of A/D converters 51 and the operational timings of primary and secondary memory controllers 57 and 58.

Primary trigger detector 55 generates a primary trigger signal if wave data satisfies preset primary trigger conditions. Upon receiving an input of the primary trigger signal, primary memory controller 57 stores the wave data in memory 54.

Secondary trigger detector 56 generates a secondary trigger signal if wave data satisfies preset secondary trigger conditions. Upon receiving an input of the secondary trigger signal, secondary memory controller 58 stores the wave data in memory 54.

The wave data stored in memory 54 is retrieved as controlled by primary and secondary memory controllers 57 and 58, and input to display image compressor 61, so that the wave data is compressed for display.

The wave data for display thus compressed is then input to display 63 and visually presented thereon, according to control provided by display controller 62. Display means 64 comprises display image compressor 61, display controller 62, and display 63.

Note that the trigger conditions include a trigger level and rising edge or falling edge detection.

For example, the timing controller makes the primary memory controller operate at a sampling frequency of 100 kHz and the secondary memory controller at a sampling frequency of 10 MHz. At the same time, the timing controller makes the A/D converters 51 operate at a sampling frequency of 10 MHz, the higher rate of those used by the primary and secondary memory controllers.

Consequently, it is possible to simultaneously save sets of wave data in the memory at different time intervals, as low-speed sampling data and high-speed sampling data, for example. A timing chart for this example is shown in FIG. 6.

Figure 6:
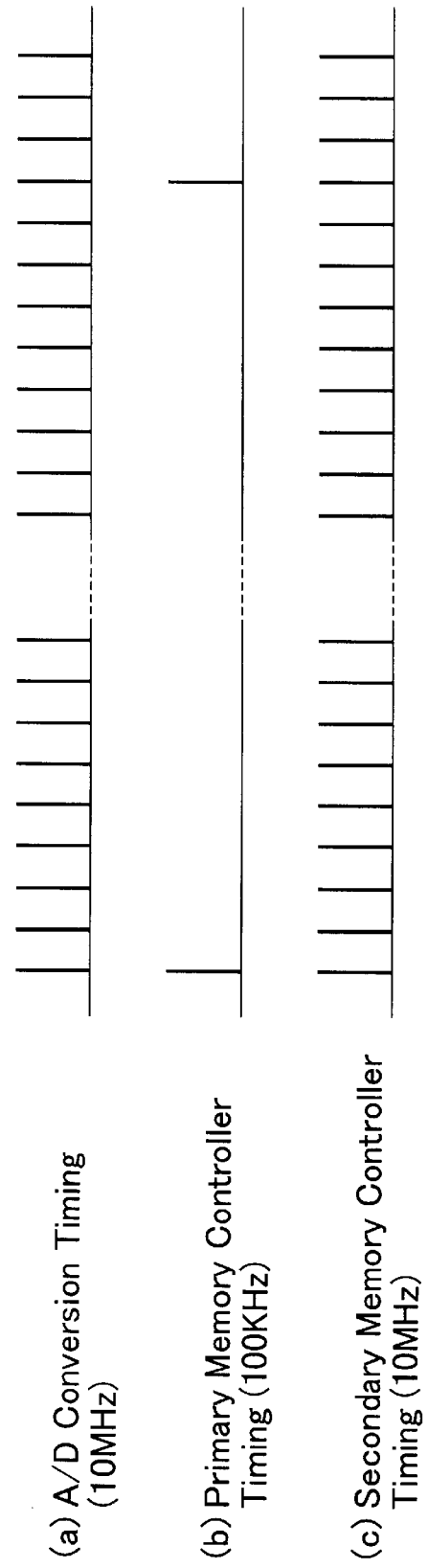
FIG. 6 is a timing chart showing the operational timing relationship between A/D converters and memory controllers.

FIG. 6 is the timing chart showing the operational timing relationship between A/D converters and memory controllers.

In FIG. 6, symbol (a) indicates the timing of A/D conversion, symbol (b) indicates the operational timing of the primary memory controller, and symbol (c) indicates the operational timing of the secondary memory controller.

Referring back to FIG. 5, primary memory controller 57 begins to save wave data in memory 54 by means of primary trigger detector 55, from the moment the wave data satisfies preset trigger conditions. Secondary memory controller 58 performs a pre-trigger action according to the secondary trigger signal of secondary trigger detector 56, in order to save wave data before and after trigger generation in memory 54 each time a trigger signal is generated.

It should be noted that pre-trigger action is intended to secure wave data in a preset memory area from a moment of trigger generation, under the condition that the wave data, while being constantly updated, is continuously and repetitively saved in the preset memory area. This means that wave data before and after the moment of trigger generation is recorded.

Primary memory controller 57 sends the active status thereof to secondary memory controller 58, which does not write wave data to memory 54 except when primary memory controller 57 is active.

As described above, since the system has a plurality of trigger detectors and a plurality of memory controllers for storing wave data in the memory, it is possible to store wave data simultaneously at different time intervals. Accordingly, both trend and transient waveforms can be recorded simultaneously using relatively small amounts of memory. It is therefore possible to realize a waveform recording system effective for waveform analysis.

Furthermore, since different sampling speeds can be set separately, it is possible to control the amounts of trend and transient wave data. For example, it is an easy task to save memory capacity by setting the trend waveform channel to a lower sampling rate or to improve the resolution of transient waveforms by setting the transient waveform channel to a higher sampling rate.

Now an explanation will be made to the way wave data is written to the memory.

Figure 7:
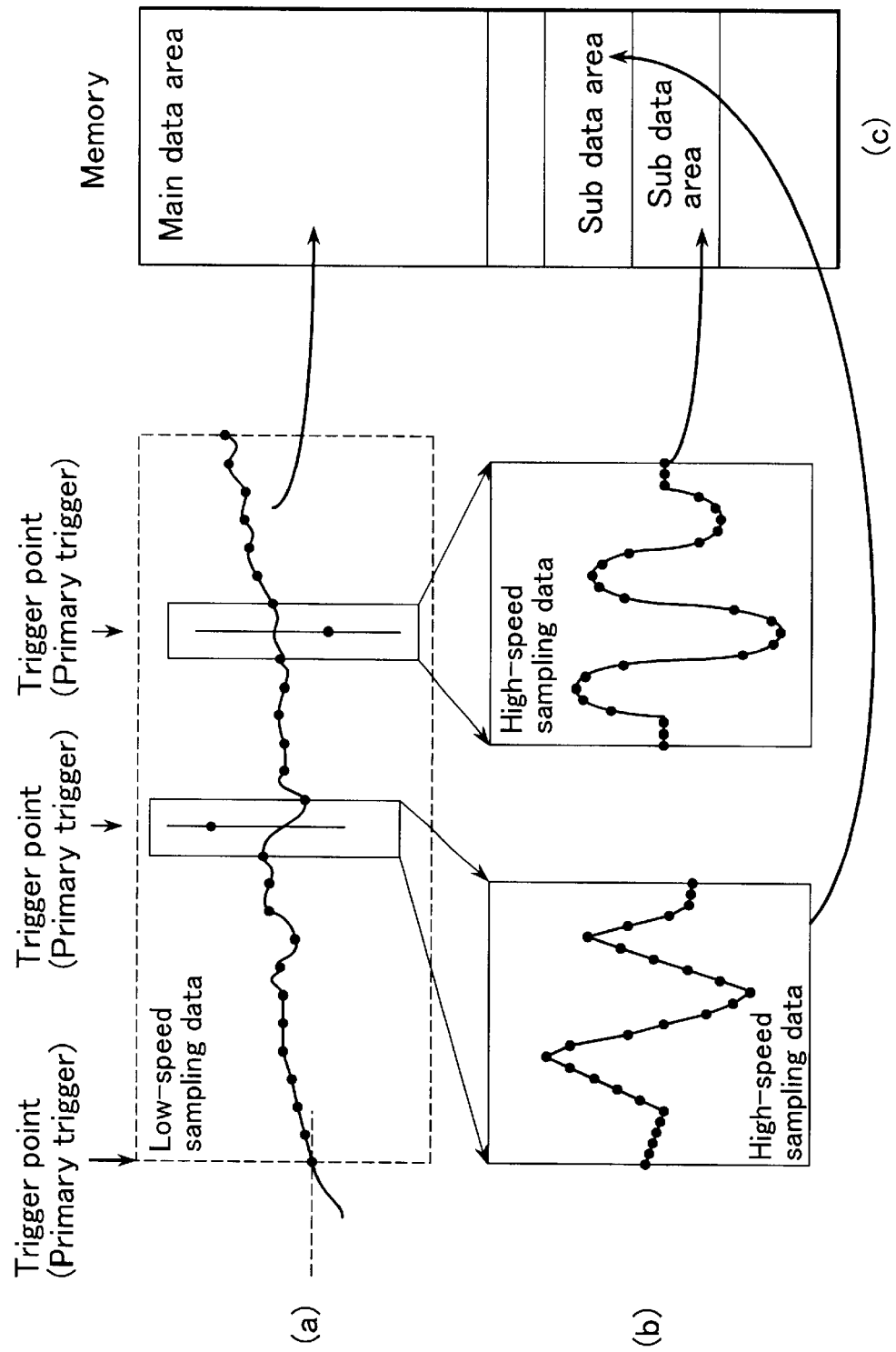
FIG. 7 is a conceptual view illustrating how written wave data is saved in the memory.

FIG. 7 is a conceptual view illustrating how written wave data is saved in the memory.

In FIG. 7, symbol (a) indicates wave data sampled by the primary memory controller at low speed. Symbol (b) indicates wave data before and after trigger generation sampled at high speed by the secondary memory controller, where pre-trigger action has been taken each time a secondary trigger signal is generated.

Symbol (c) indicates the content of the memory, which is partitioned into a main data area where the low-speed sampling data of a waveform being measured is written, and into sub data areas where high-speed sampling data is written.

The low-speed sampling data is written into the main data area as dictated by a primary trigger signal, whereas the high-speed sampling data is written into the sub data area each time a secondary trigger signal occurs.

If necessary, it is possible to provide means for adding trigger information that attach trigger information to wave data saved in the aforementioned main data area by means of the primary memory controller when a secondary trigger is generated at the secondary memory controller.

As a result, it is possible to show markers or the like on a trend waveform, which indicates the generation of secondary triggers.

Addition of trigger information can be achieved by storing the address of wave data saved in the main data area when a secondary trigger is generated, or by attaching bit data or the like to the wave data itself.

As discussed above, by adding trigger information to wave data stored in the main data area using the primary memory controller, it is possible to show markers or the like indicating generation of secondary triggers, on a trend waveform. Consequently, it becomes easy to identify, for example, at which point in the trend waveform a change has occurred.

It is also possible to forcibly generate a trigger signal for acquiring low-speed sampling data or compressed wave data according to the preset trigger generation mode, thus actuating the primary memory controller using the trigger signal.

The trigger generation mode includes roll operation mode and external trigger operation mode, from which an arbitrary selection can be made. Note that roll operation mode refers to an operating mode in which trigger signals are forcibly generated to continuously store wave data in the memory so that a recorder constantly records measurement results on chart paper.

In the roll operation mode, it is also possible to operate the primary memory controller by generating trigger signals by, for example, manual operation.

As described above, trigger signals are forcibly generated according to the preset trigger generation mode and, therefore, acquisition of wave data into the memory begins without having to wait for trigger action. Consequently, it is possible to simultaneously record transient data, such as the data of a sudden waveform abnormality, while constantly recording the low-speed sampling data of waveforms being measured or trend waveforms based on compressed data. Accordingly, it is possible to realize a waveform recording system that is effective for the constant monitoring of the wave data being measured.

Referring back to FIG. 5, compression means 59 begins acquiring wave data at an acquisition start point. Thus, the compression means acquires wave data composed of a prescribed number of items (n items), on a compression interval basis, in order to produce compressed wave data according to a prescribed data compression ratio. This compressed wave data is stored in memory 54 through primary memory controller 57.

The compression method to be used in this case is, for example, P-P compression wherein maximum and minimum values are obtained from the prescribed number of continuously acquired wave data items, so that the values are used as the compressed wave data.

Compression means 60, like compression means 59, acquires wave data composed of a prescribed number of items (n items), on a compression interval basis, in order to produce compressed wave data according to a prescribed data compression ratio. This compressed wave data is stored in memory 54 through secondary memory controller 58. Different or identical data compression ratios are set in compression means 59 and 60 for appropriate wave data compression.

Since wave data is acquired at a plurality of different sampling rates, an amount of wave data larger than the amount when the wave data is acquired using a single sampling datum is stored in the memory. An attempt in this situation to display the whole image of wave data acquired at individual sampling rates, therefore, will result in a significant increase in the display processing time. In contrast, it is possible to increase the speed of display processing by creating display data using compressed wave data produced by compression means.

As has also been described in this embodiment with reference to FIG. 3, triggers are generated at arbitrary points, irrespective of the data compression ratio of wave data.

Consequently, when compressed wave data is used in an attempt to achieve a high-speed waveform display, it occurs that the display start point t2 of the wave data does not agree with the acquisition start point t1 of n times of wave data acquisition, as shown in FIG. 3. This results in misalignment between the wave data and compressed wave data.

For this reason, wave data stored in memory 54 ranging from the display start point t2 to the nth point of acquisition is input to compression means 59 and 60 using primary and secondary memory controllers 57 and 58. The wave data is thus recompressed in order to reproduce and store compressed wave data in memory 54. This data is used as wave data at the start point of compressed waveform display.

Accordingly, there is no need for using the part of the wave data responsible for misalignment between the views of the wave data and the compressed wave data. Consequently, it is possible to prevent errors from occurring between the views of the wave data and the compressed wave data and to prevent these views from being misidentified.

Furthermore, a plurality of compression means can be provided for a single memory controller. Also in this case, it is possible to previously produce compressed wave data consisting of a plurality of wave data P-P compressed at multiple steps of data compression ratio, and use compressed wave data produced at a data compression ratio optimum for a preset display magnification as waveform display data, so that not only full-wave single-frame views are provided but also waveforms are shown at high speeds even when a particular display magnification is set.

In addition, compressed wave data in memory 54 ranging from the display start point t2 to the nth point of acquisition, is input to compression means 59 and 60 using primary and secondary memory controllers 57 and 58, as shown in FIG. 3. The wave data is thus re-compressed in order to reproduce and store compressed wave data in memory 54. This data is used as the wave data at the start point of compressed waveform display.

Accordingly, there is no need for using the part of wave data responsible for misalignment between the views of the wave data and compressed wave data. Consequently, it is possible to prevent errors from occurring between the views of the wave data and the compressed wave data and to prevent these views from being misidentified.

Alternatively, compression means can be provided to only one of a plurality of memory controllers. Thus, compression means can be omitted if sufficient memory capacity is available at the time of high-speed sampling. This will lead to cost reductions.

Also alternatively, it is possible to use compressed wave data in place of the wave data acquired at low sampling rates, in order to display waveforms. Since compression means takes maximum and minimum values from the prescribed number of continuously acquired wave data items and uses these values for compressed wave data, the compressed wave data can be used in place of the wave data acquired at low sampling rates.

This means that the compressed wave data is treated as trend wave data and the high-speed sampling data is treated as transient data, and both wave data are simultaneously saved in the memory. Consequently, it is possible to record both the trend and transient wave data simultaneously, using relatively small amounts of memory. It is therefore possible to realize a waveform recording system effective for waveform analysis.

What is claimed is:

1. A waveform recording system for converting analog wave signals being measured to wave data, storing said wave data in memory, reading said wave data stored in said memory, and indicating the waveform of said wave data on a display, wherein compressed wave data is produced from said wave data for each prescribed compression interval and said compressed wave data having the display start point or display end point of said wave data in said compression interval is produced by re-compressing a part of said wave data used for display.

2. A waveform recording system for converting analog wave signals being measured to wave data, storing said wave data in memory, reading said wave data stored in said memory, and indicating the waveform of said wave data on a display, said waveform recording system being provided with compression means for producing compressed wave data from said wave data for each prescribed compression interval according to a prescribed data compression ratio and a memory controller for storing said wave data and said compressed wave data in said memory and sending said wave data and said compressed wave data to display means having said display, wherein said memory controller selects a set of wave data used for display from among said wave data in said compression interval containing said wave data's display start point and display end point and inputs said set of wave data to said compression means, and stores produced re-compressed wave data in said memory.

3. The waveform recording system of claim 2, wherein a plurality of compression means is provided each of which compresses said wave data at a different compression ratio.

4. The waveform recording system of claim 3, wherein appropriate compressed wave data is read from said memory according to a given display rate, in order to provide compressed waveform views.

5. The waveform recording system of claim 3, wherein one of said plurality of compression means is set to a data compression ratio at which a full waveform can be displayed in a single frame.

6. A waveform recording system for converting analog wave signals being measured to wave data, storing said wave data in memory, reading said wave data stored in said memory, and indicating the waveform of said wave data on a display, said waveform recording system being provided with at least one compression means for producing compressed wave data from said wave data for each prescribed compression interval according to a prescribed data compression ratio, and with a plurality of memory controllers each of which stores said wave data having a different sampling rate in said memory, wherein at least one of said plurality of memory controllers stores said compressed wave data along with said wave data in said memory, selects a part of said wave data used for display from among said wave data in said compression interval containing said wave data's display start point and display end point for input to said compression means, and stores the re-compressed wave data produced therein in said memory.

7. The waveform recording system of claim 6, wherein said plurality of memory controllers comprises a primary memory controller for storing the low-speed sampling data of said wave data from the moment said wave data satisfies preset primary trigger conditions and a secondary memory controller for storing the high-speed sampling data of said wave data concurrently with said low-speed sampling data, from the moment said wave data satisfies preset secondary trigger conditions.

8. The waveform recording system of claim 7, wherein trigger information addition means for adding trigger generation information to said high-speed sampling data when said secondary trigger conditions are satisfied is provided in order to correlate said high-speed sampling data with said low-speed sampling data according to said trigger generation information before said low-sampling data and high-sampling data are stored in memory.

9. The waveform recording system of claim 6, wherein a trigger signal is forcibly generated according to a preset trigger generation mode, and said low-speed sampling data is stored in said memory according to said trigger signal, and said high-speed sampling data is stored in said memory concurrently with said low-speed sampling data, from the moment said wave data satisfies preset trigger conditions.

10. The waveform recording system of claim 7 or 8, wherein said compressed wave data is used in place of said low-speed sampling data.

* * * * *